United States Patent
Hundt et al.

(10) Patent No.: US 6,586,821 B1
(45) Date of Patent: Jul. 1, 2003

(54) LEAD-FRAME FORMING FOR IMPROVED THERMAL PERFORMANCE

(75) Inventors: Michael J. Hundt, Denton, TX (US); Tiao Zhou, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/605,643

(22) Filed: Jun. 28, 2000

Related U.S. Application Data

(63) Continuation of application No. 08/880,566, filed on Jun. 23, 1997, now abandoned.

(51) Int. Cl.[7] .......................... H01L 23/48; H01L 23/28; H01L 23/50; H01L 23/495; H01L 23/10
(52) U.S. Cl. .................. 257/666; 257/676; 257/696; 257/698; 257/670; 257/671; 257/672
(58) Field of Search ................................ 257/666, 676, 257/696, 698, 690, 670, 671, 672

(56) References Cited

U.S. PATENT DOCUMENTS

| | | | |
|---|---|---|---|
| 4,714,952 A | 12/1987 | Takekawa et al. | 357/75 |
| 4,868,635 A | 9/1989 | Frechette et al. | 357/70 |
| 4,984,059 A | 1/1991 | Kubota et al. | 357/68 |
| 4,987,473 A | 1/1991 | Johnson | 357/70 |
| 5,089,879 A | 2/1992 | Komenaka | 357/72 |
| 5,291,059 A | 3/1994 | Ishitsuka et al. | 257/666 |
| 5,309,027 A | 5/1994 | Letterman, Jr. | 257/796 |
| 5,334,872 A | 8/1994 | Ueda et al. | 257/675 |
| 5,386,141 A | 1/1995 | Liang et al. | 257/676 |
| 5,420,758 A | 5/1995 | Liang et al. | 361/813 |
| 5,430,331 A | 7/1995 | Hamzehdoost et al. | 257/796 |
| 5,468,993 A | 11/1995 | Tani | 257/676 |
| 5,486,722 A | 1/1996 | Sato et al. | 257/666 |
| 5,521,432 A | 5/1996 | Tsuji et al. | 257/677 |
| 5,530,281 A | 6/1996 | Groover et al. | 257/666 |
| 5,606,199 A | 2/1997 | Yoshigai | 257/666 |
| 5,637,915 A | 6/1997 | Sato et al. | 257/666 |
| 5,693,984 A | 12/1997 | Ootsuki | 257/796 |
| 5,703,398 A | 12/1997 | Sono et al. | 257/706 |
| 5,763,942 A | 6/1998 | Suzuki | 257/669 |
| 5,767,572 A | 6/1998 | Fujitsu | 257/668 |
| 5,783,860 A | 7/1998 | Jeng et al. | 257/675 |
| 5,814,877 A | 9/1998 | Diffenderfer et al. | 257/666 |
| 5,834,691 A | 11/1998 | Aoki | 174/52.4 |
| 5,914,528 A | 6/1999 | Takiar et al. | 257/666 |
| 5,916,696 A | 6/1999 | Abys et al. | 428/670 |
| 5,973,407 A | 10/1999 | Tzu et al. | 257/796 |

FOREIGN PATENT DOCUMENTS

| | | | | |
|---|---|---|---|---|
| JP | 02197158 | 8/1990 | | H01L/23/50 |
| JP | 03160749 | 7/1991 | | H01L/23/50 |
| JP | 04044255 | 2/1992 | | H01L/23/50 |
| JP | 07030038 | 1/1995 | | H01L/23/50 |

*Primary Examiner*—Alexander O. Williams
(74) *Attorney, Agent, or Firm*—Lisa K. Jorgenson; Renee Michelle Larson

(57) ABSTRACT

A lead frame of a plastic integrated circuit package is fabricated in two steps. First, from a rectangular sheet of metal, lead fingers of the lead frame are formed. Second, the die pad of the lead frame is clamped and is simultaneously separated and downset from the lead fingers of the lead frame by shearing the lead frame with a mated punch die pair. Performing the separation and downset of the die pad from the lead fingers results in essentially no horizontal gap between the lead fingers and the die pad. The downset of the die pad with respect to the lead fingers results in a vertical separation between the die pad and the lead fingers.

6 Claims, 14 Drawing Sheets

LEAD-FRAME FORMING FOR IMPROVED THERMAL PERFORMANCE

This application is a continuation of Ser. No. 08/880,566 filed Jun. 23, 1997 now abandoned.

FIELD OF THE INVENTION

The present invention relates generally to integrated circuit device packages, and more specifically to a plastic integrated circuit device package with a lead frame having improved thermal dissipation characteristics.

BACKGROUND OF THE INVENTION

The trend in the electronics industry towards higher density integrated circuit devices has required that packages which house such higher density integrated circuit devices be able to dissipate more power. Because high density integrated circuit devices require more power and thus generate more heat, the manner in which the integrated circuit device package dissipates heat is critical. Generally speaking, it is quite advantageous to remove the heat from the integrated circuit device to the outside environment as quickly as possible.

The critical thermal path for removing heat from the integrated circuit device is defined as the path: (1) from the integrated circuit die to the die pad on which the integrated circuit die is seated, (2) from the die pad, by way of the horizontal air gap between the lead fingers and die pad, to the lead fingers of the lead frame, and (3) from the lead fingers to the printed circuit board on which the integrated circuit device is seated. Shortening this thermal path improves the thermal dissipation characteristics of the integrated circuit device package. As integrated circuit devices become more dense and thus must dissipate higher power, there is a continual need in the art to improve the heat dissipation characteristics of integrated circuit devices by shortening the thermal path of integrated circuit device packages.

A lead frame is the backbone of a molded plastic package. Lead frames are described in Chapter 8 of the 1989 edition of the Microelectronics Packaging Handbook (available from Van Nostrand Reinhold, 115 Fifth Avenue, New York, N.Y. 10003). In general, a lead frame is fabricated from a strip of sheet metal by stamping or chemical milling. The lead frame serves first as a holding fixture during the assembly process, then, after molding, becomes an integral part of the package. A lead frame includes a plurality of finger-like connections that extend from the periphery of the lead frame toward a center die pad. A semiconductor or chip is mounted on the center die pad.

Lead frames are either chemically milled or mechanically stamped from rolled strip stock. Typical strip thickness is approximately 0.25 mm, with thinner material (of approximately 0.20 mm) used for high lead-count packages such as 84-pin PLCC and quad flat pacs. Chemical milling is a process that uses photolithography and metal-dissolving chemicals to etch a pattern from a metal strip.

Stamped lead frames are fabricated by mechanically removing metal from strip stock with tools called progressive dies. The energy required to shear metal is directly proportional to the length of shear. Lead frames have large shear lengths per unit area. Therefore, a large amount of energy is required to stamp a full frame with one press stroke. Progressive dies are usually made of tungsten carbide and are arranged in stations. Each station punches a small area of metal from the strip as it moves through the die set.

To allow for the cutting tool, also known as a punch die, to be strong enough to operatively cut the lead frame, the prior art uses a cutting tool that has a narrow width of approximately 0.2 mil at the end increasing in width to a maximum width of approximately 30 to 40 mil at the base.

Referring to FIGS. 1a to 7b, the manufacturing process for fabricating a conventional lead frame 10 of a plastic integrated circuit package according to the prior art is illustrated. Fabrication begins with a rectangular sheet of metal from which the plurality lead fingers 12 of the lead frame are formed. Referring to FIG. 1a, the top view of a quadrant of a lead frame 10 after the lead fingers 12 have been defined, including a quadrant of die pad 14, is shown. The plurality of lead fingers 12 are formed from a rectangular sheet of metal as is well known in the art. FIG. 1b illustrates the cross-sectional view of the quadrant of the lead frame 10 at this stage of the process. The next step in the prior art process, as shown in the top view of FIG. 2a, is to clamp the lead frame 10 into a fixed position prior to being cut with a punch die 22. FIG. 2b illustrates the cross-sectional view of the quadrant of the lead frame 10, the upper clamp 18 and lower clamp 20, and the punch die 22. The next step in the prior art process, as shown in the top view of FIG. 3a, is to separate the lead fingers 12 from the die pad 14 of the lead frame. At a substantially central portion of the lead frame 10, a square die pad 14, configured for mounting a semiconductor or chip thereon, supported by a plurality of suspension tie bars 16 is formed by cutting the lead frame 10 with the punch die 22. The punch die 22 having a plurality of recesses along the cutting surface forming the plurality of tie bars 16 as the lead frame 10 is cut. FIG. 3b illustrates the cross-sectional view of the quadrant of the lead frame, the upper clamp 18 and lower clamp 20, and the punch die 22 after the lead frame 10 is cut with the punch die 22. Tie bars 16 connect lead fingers 12 to die pad 14. FIG. 4a is a top view of a quadrant of the lead frame after the lead frame has been cut with a punch die 22 showing the physical separation aim between the lead fingers and the die pad 14. FIG. 4b illustrates the cross-sectional view of the quadrant of the lead frame at this stage of the process. FIG. 5 is a top view of the lead frame after the top and bottom portions of the lead frame have been cut with a punch die 22. FIGS. 6a and 6b illustrate the lead frame showing the physical separation between the lead fingers 12 and the die pad 14. The plurality of lead fingers 12 extend from the periphery of the lead frame 10 to a position spaced apart from the die pad 14 with a predetermined distance represented as $\Delta > 0$, where $\Delta$ is defined as the horizontal gap between the lead fingers 12 and the die pad 14. It is also clear that the lead fingers 12 and the die pad 14 are co-planar at this stage of the fabrication process. Referring to FIGS. 7a and 7b, the last step of the process is to downset the die pad 14 in relation to the lead fingers 12. In performing the downset, it is noted that the physical separation between the lead fingers 12 and the die pad 14, represented as $\Delta > 0$, is maintained. Additionally, the downset of die pad 14 results in a vertical separation between lead fingers 12 and die pad 14.

Referring to FIG. 8, the fabrication of the lead frame of a plastic integrated circuit package, according to the prior art, is illustrated in process flow 30. First, the lead frame begins as a flat metal sheet as shown in step 32. Next, at step 34, the lead fingers 12 are defined. Step 34 corresponds to FIGS. 1a and 1b. After the lead fingers 12 are defined, they are separated from the die pad 14 in step 36, Step 36 corresponds to FIGS. 3a and 3b. Finally, at step 38, the die pad 14 is downset with respect to the lead fingers 12 as illustrated in FIGS. 7a and 7b.

According to the lead frame formed in FIGS. 1–8, the critical thermal path by which heat must be dissipated is defined as the distance from the integrated circuit die to the downset die pad 14 on which the integrated circuit die is placed; from the die pad 14, by way of the horizontal air gap $\Delta$ between the lead fingers 12 and die pad 14, to lead fingers 12; and from lead fingers 12 to the printed circuit board on which the integrated circuit device is placed. Shortening this thermal path would improve the thermal dissipation characteristics of the integrated circuit device. There is therefore an unmet need in the art to shorten the critical thermal path of the prior art lead frame used in plastic integrated circuit device packages.

SUMMARY AND OBJECTS OF THE INVENTION

It is therefore an object of the present invention to shorten the critical thermal path of the prior art lead frame used in plastic integrated circuit device packages.

Therefore, according to a preferred embodiment of the present invention, a process for fabricating a lead frame of a plastic integrated circuit package is disclosed. Fabrication begins with a rectangular sheet of metal from which the plurality lead fingers of the lead frame are formed as is well known in the art. Next, the lead frame is clamped into a fixed position. Finally, the die pad of the lead frame is simultaneously separated and downset from the lead fingers of the lead frame by shearing the lead frame with a punch die pair. At a substantially central portion of the lead frame, a square die pad, configured for mounting a semiconductor or chip thereon, supported by a plurality suspension tie bars is formed by shearing the lead frame with a punch die pair and a lower clamp that are mated such that the punch die pair may be inserted into the lower clamp with essentially a negligible gap of no more than 2 percent of the lead frame thickness. The punch die pair having 90 degree cutting surfaces and a plurality of recesses along the cutting surfaces forming the plurality tie bars as the lead frame is sheared. Tie bars connect lead fingers to the die pad. Performing the separation and downset of the die pad from the lead fingers results in essentially no horizontal gap between the lead fingers and the die pad. However, the downset of the die pad with respect to the lead fingers does result in a vertical separation between the die pad and the lead fingers that was also seen in the prior art. The separation and downset step may be accomplished by a simultaneous cutting and pressing operation resulting in the lead frame being sheared.

The lead frame of the preferred embodiment of the present invention has a shorter critical thermal path than the prior art lead frame since there is essentially no horizontal gap between the lead fingers and the die pad of the lead frame, unlike the prior art lead frame. The shorter critical thermal path means that the lead frame is much more efficient at dissipating the heat generated by high density integrated circuit devices.

According to an alternate embodiment of the present invention, the step of simultaneously separating and downsetting the die pad with respect to the lead fingers of the lead frame may be separated into two steps. First, the lead fingers are separated from the die pad using a cutting tool, such as a laser, that results in essentially no horizontal gap. Second, the die pad is downset with respect to the lead fingers. There is the vertical gap between the lead fingers and the die pad caused by the downset of die pad. The alternate process of forming the lead frame still provides the advantage of shortening the critical thermal path of the lead frame and therefore improve s the thermal dissipation characteristics of any plastic integrated circuit device package into which it is placed. However, the alternate embodiment has more process steps than does the preferred embodiment.

These and other objects of the invention will become apparent from the detailed description of the invention in which numerals used throughout the description correspond to those found in the drawing figures.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

Effective thermal enhancement of an integrated circuit device may be obtained by shortening its critical thermal path. A cost effective solution is to reduce the distance from the die pad to the lead gap in the lead frame forming process. Minimizing the distance from the die pad to the lead fingers will result in superior thermal performance for plastic integrated circuit device packages, including Plastic Quad, Flat Pack (PQFP) packages, compared to traditional lead frame manufacturing processes.

Figures 1A, 1B:
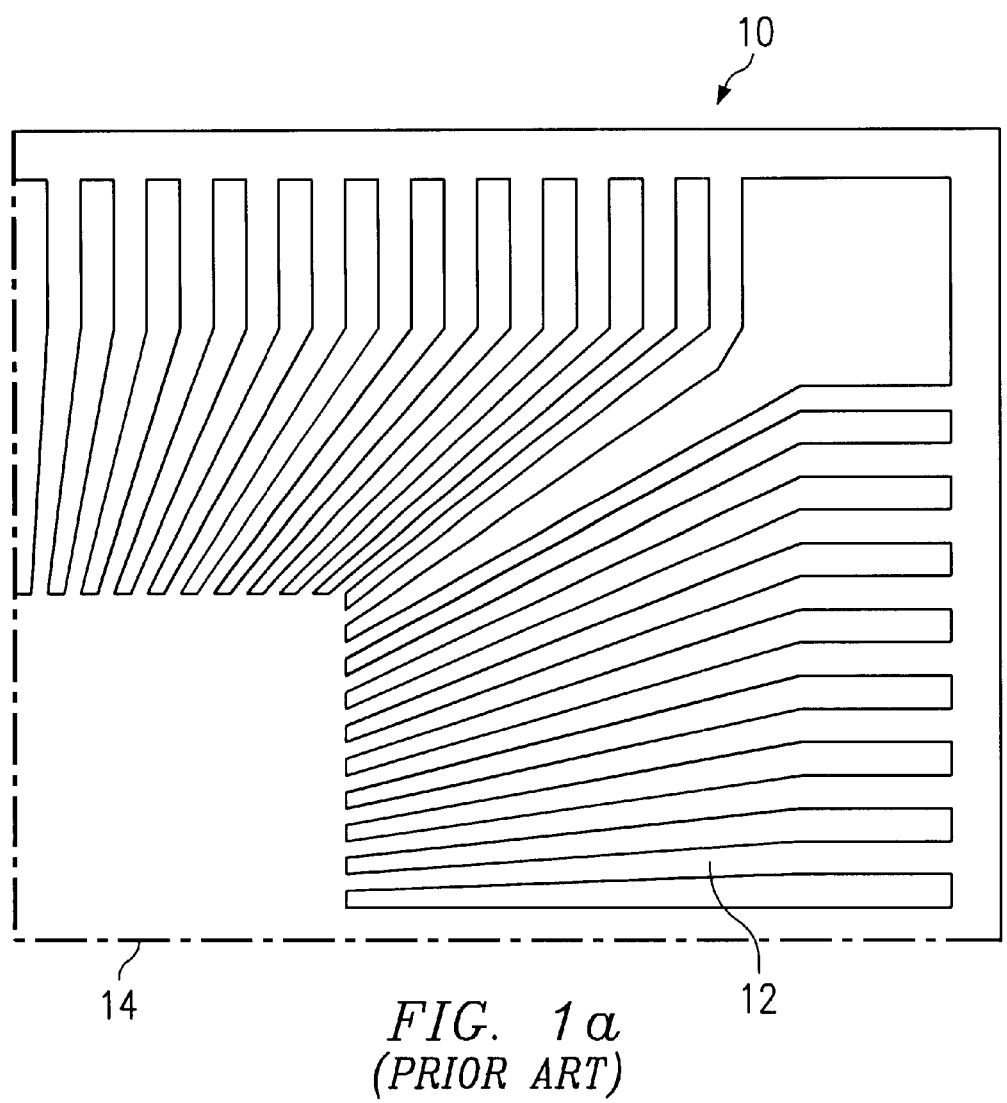
FIG. 1a is a top view of a quadrant of a lead frame after the lead fingers have to been defined, according to the prior art.
FIG. 1b is a cross-sectional view of the quadrant of the lead frame of FIG. 1a, according to the prior art.
Figure 2A:
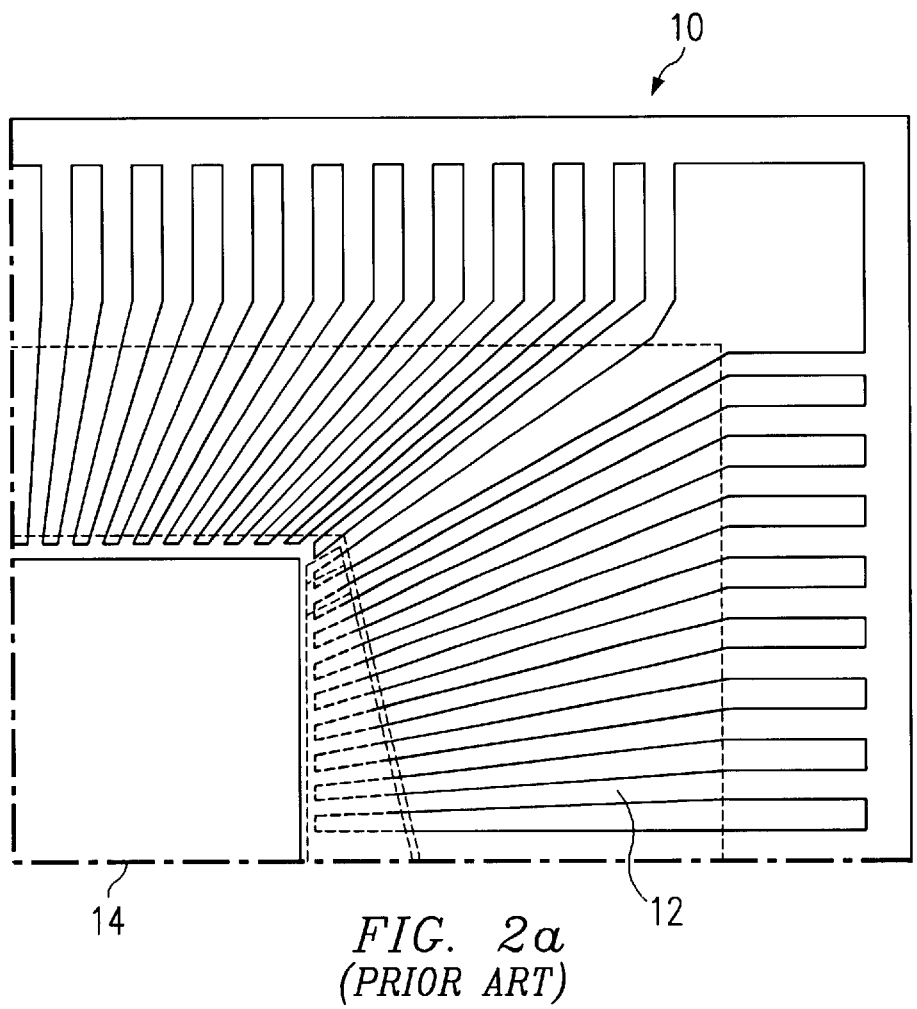
FIG. 2a is a top view of a quadrant of the lead frame after the lead frame has been clamped, according to the prior art.
Figure 2B:
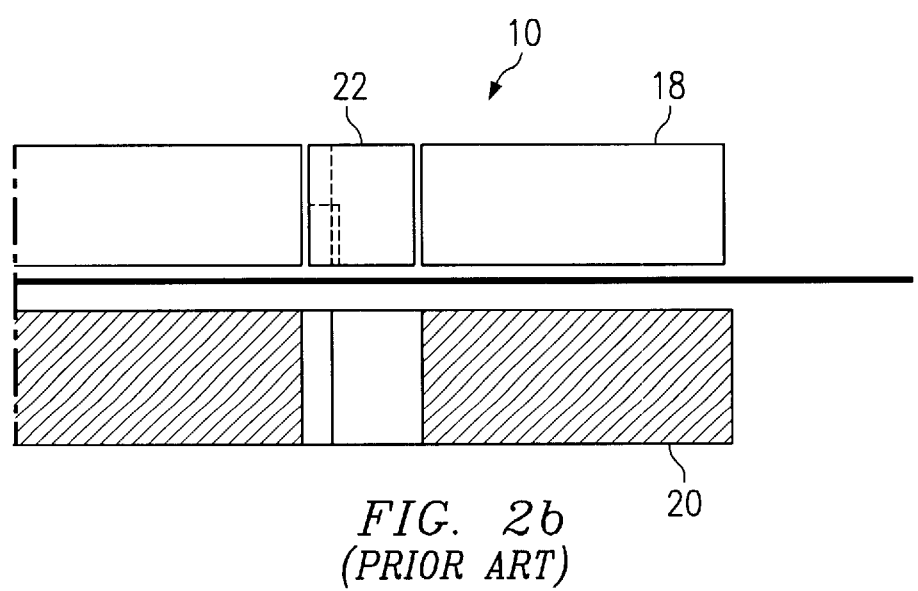
FIG. 2b is a cross-sectional view of the quadrant of the lead frame of FIG. 2a, according to the prior art.
Figure 3A:
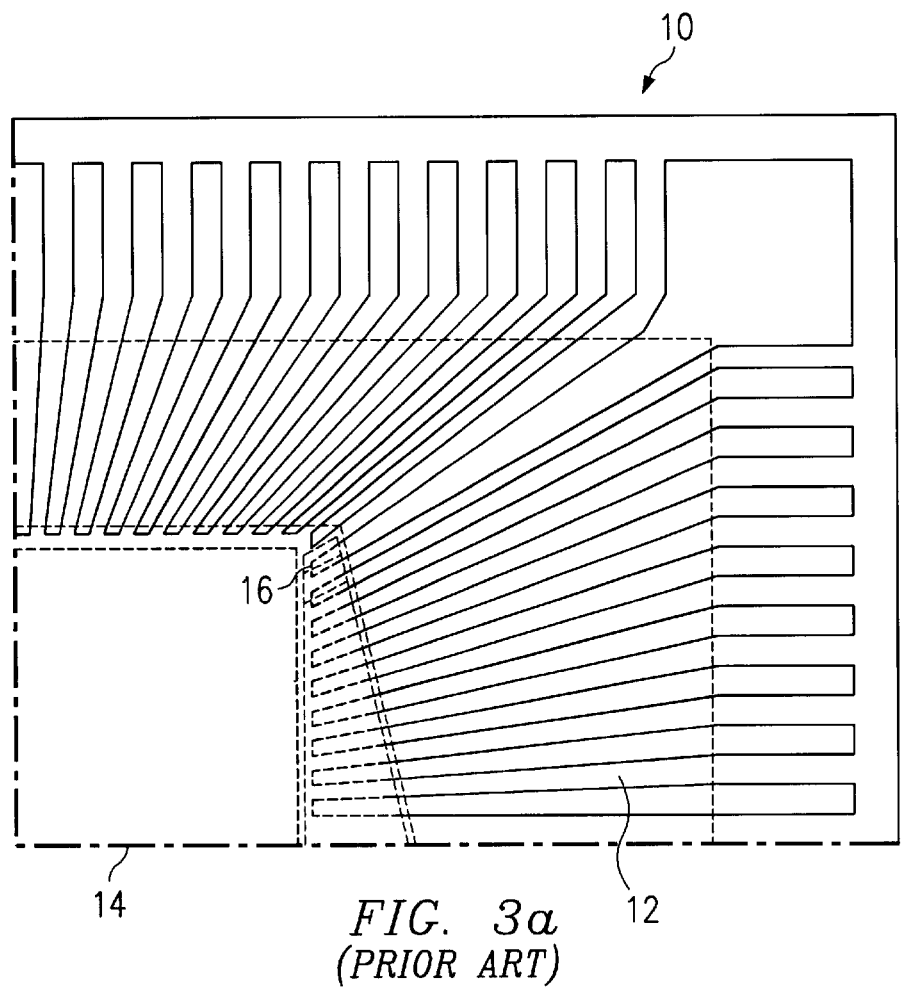
FIG. 3a is a top view of a quadrant of the lead frame after the lead frame has been cut with a punch die, according to the prior art.
Figure 3B:
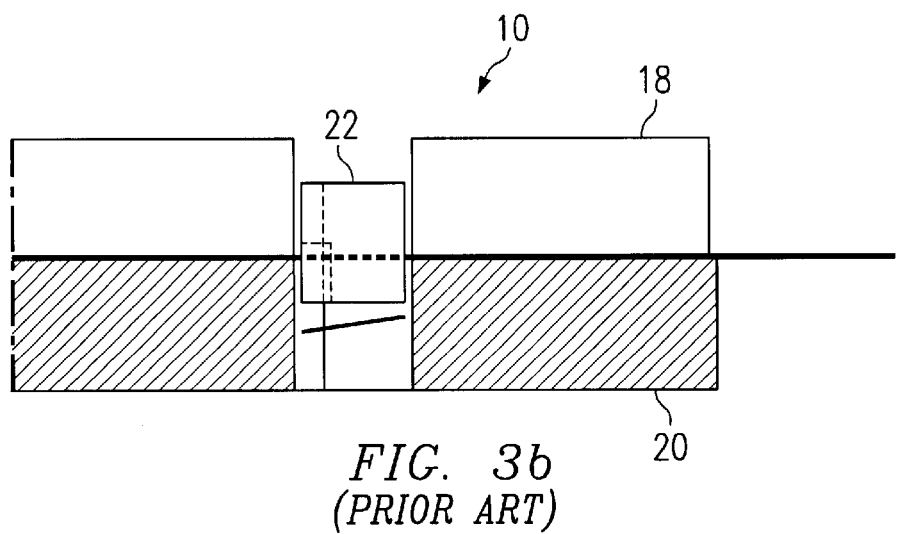
FIG. 3b is a cross-sectional view of the quadrant of the lead frame of FIG. 3a, according to the prior art.
Figure 4A:
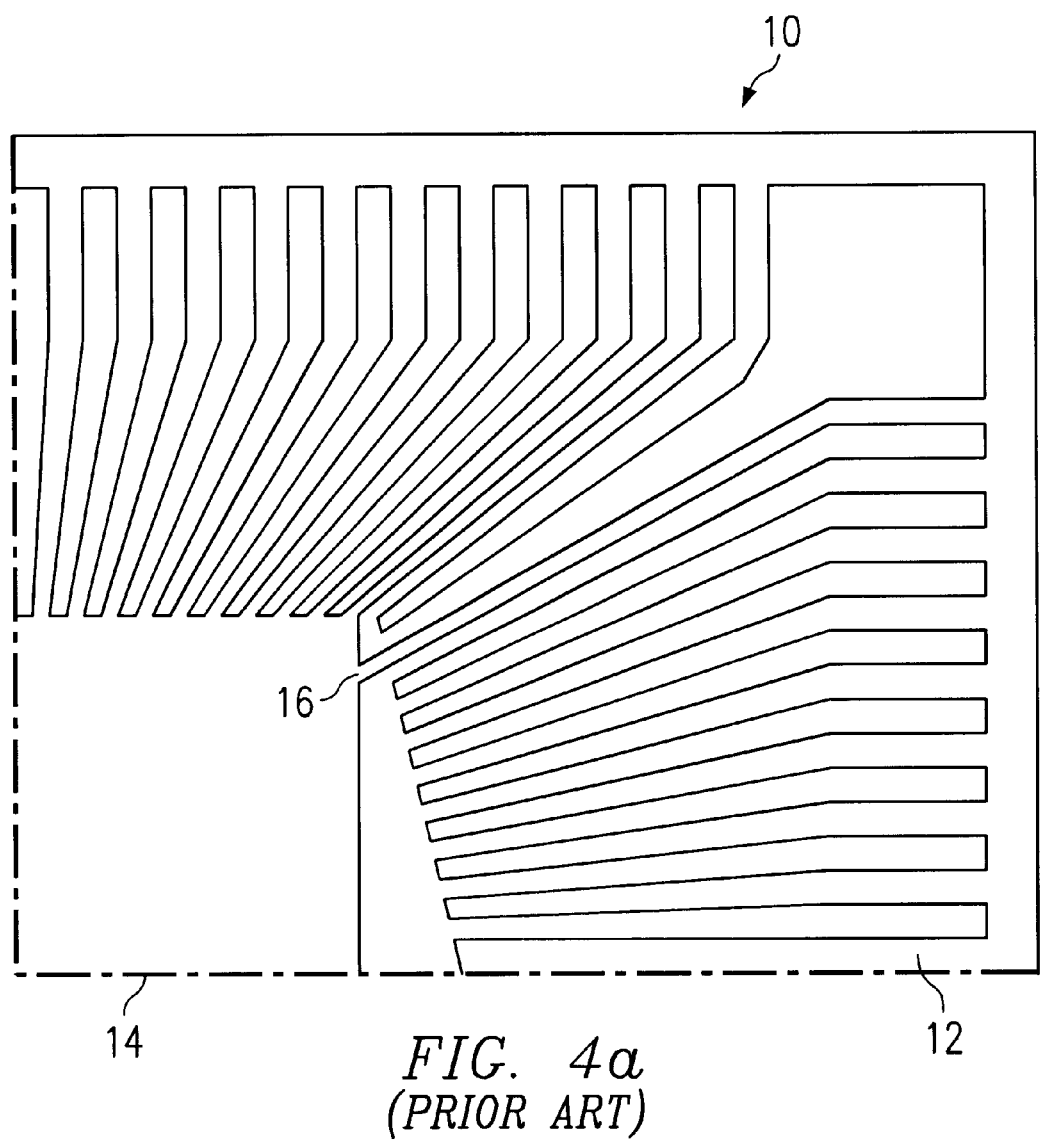
FIG. 4a is a top view of a quadrant of the lead frame after the lead frame has been cut with a punch die showing the physical separation between the lead fingers and the die pad, according to the prior art.
Figure 4B:
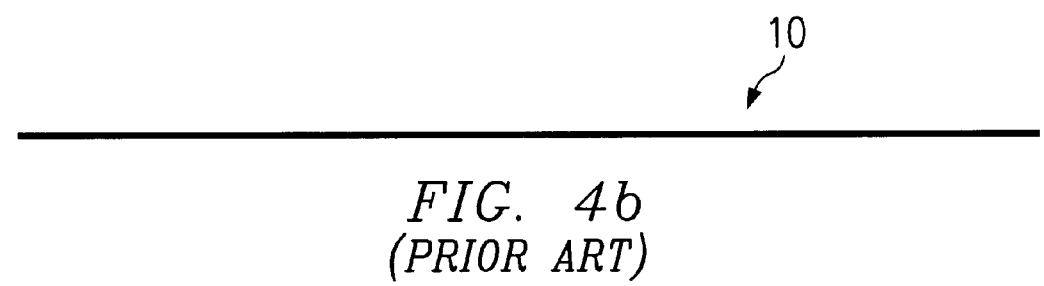
FIG. 4b is a cross-sectional view of the quadrant of the lead frame of FIG. 4a, according to the prior art.
Figure 5:
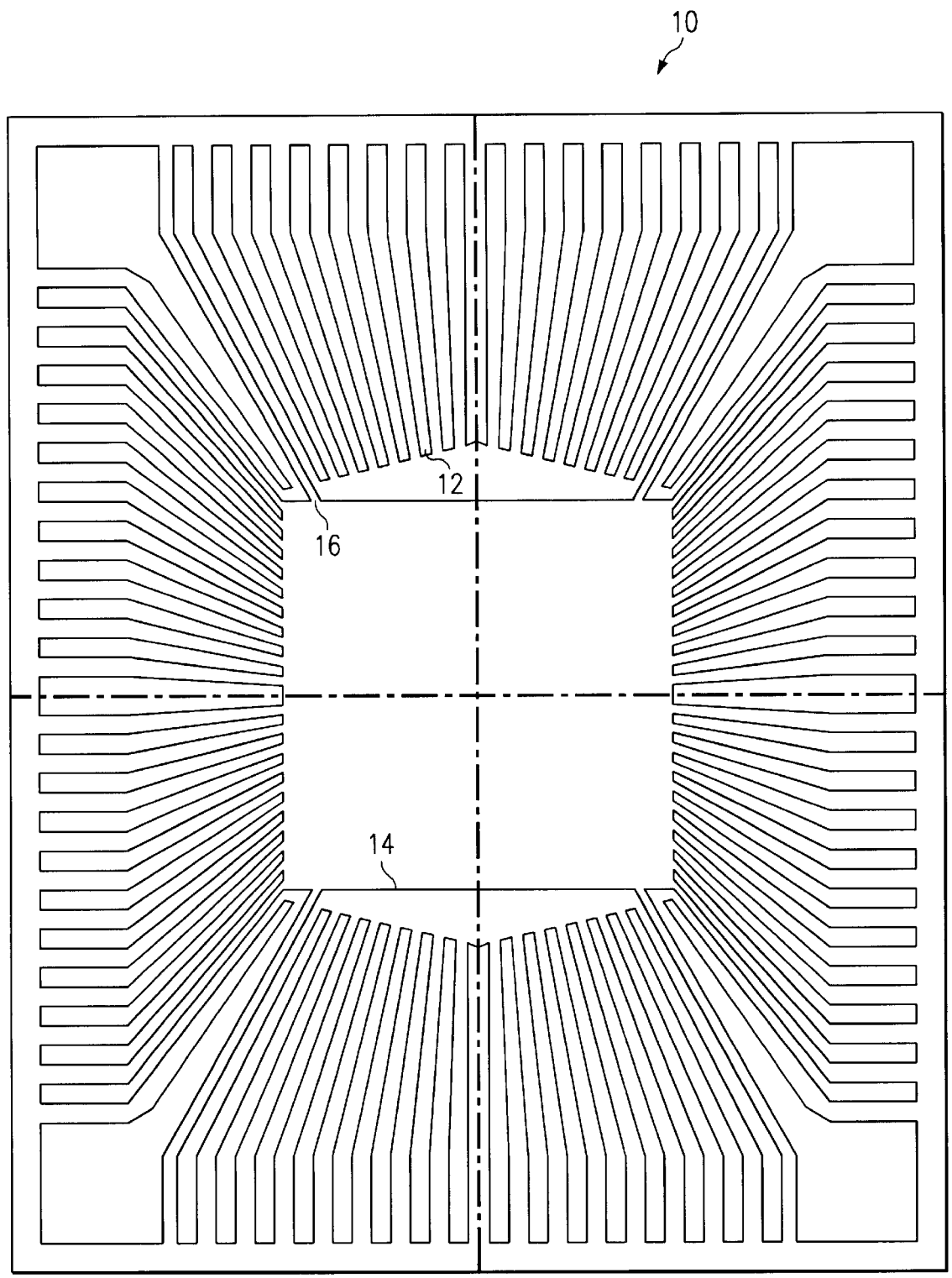
FIG. 5 is a top view of the lead frame after the top and bottom portions of the lead frame have been cut with a punch die, according to the prior art.
Figure 6A:
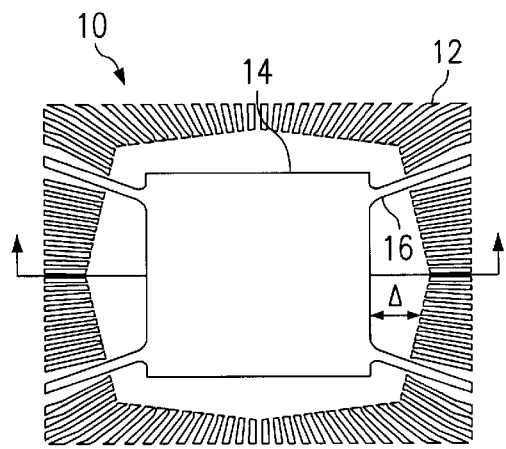
FIG. 6a is a top view of the lead frame after the lead fingers have been separated from the die pad, according to the prior art.
Figure 6B:
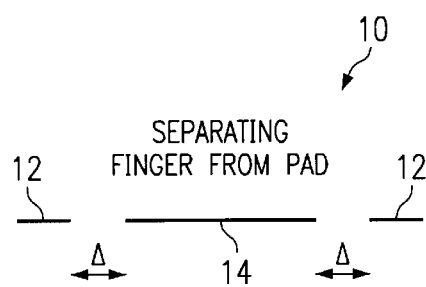
FIG. 6b is a cross-sectional view of the lead frame of FIG. 6a, according to the prior art.
Figure 7A:
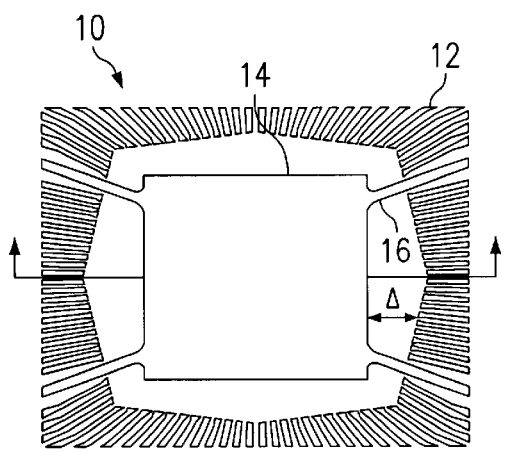
FIG. 7a is a top view of the lead frame after the die pad ha s been downset with respect to the lead fingers of the lead frame, according to the prior art.
Figure 7B:
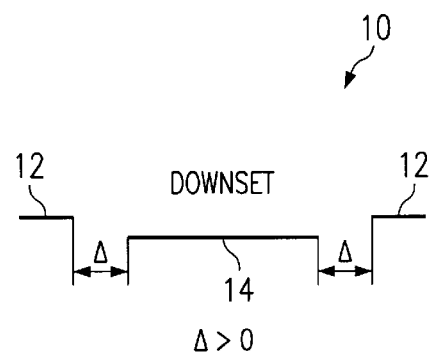
FIG. 7b is a cross-sectional view of the lead frame of FIG. 7a, according to the prior art.
Figure 8:
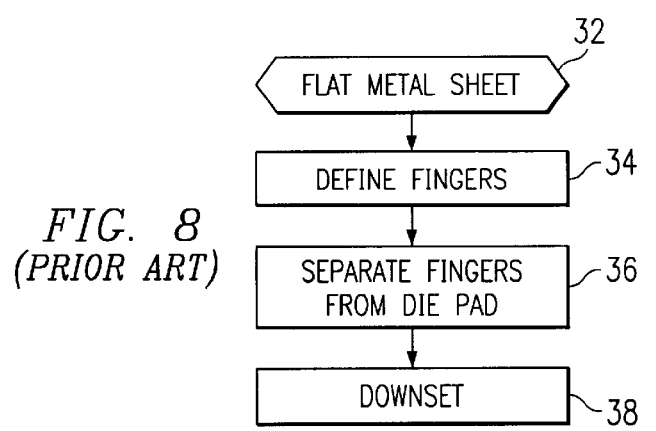
FIG. 8 is the process flow for fabricating a lead frame of a plastic integrated circuit package, according to the prior art.
Figure 9A:
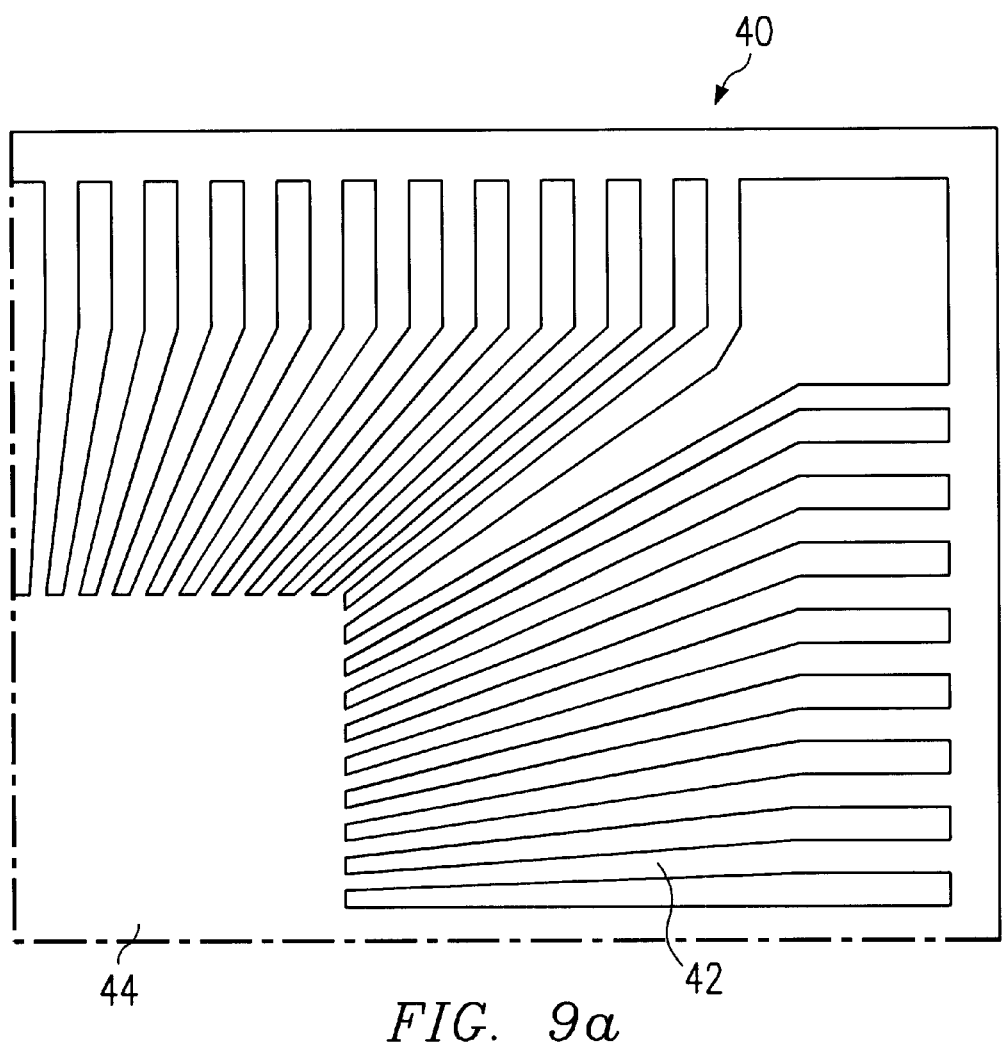
FIG. 9a is a top view of a quadrant of a lead frame after the lead fingers have been defined, according to the present invention.
Figure 9B:
FIG. 9b is a cross-sectional view of the quadrant of the lead frame of FIG. 9a, according to the present invention.
Figure 10A:
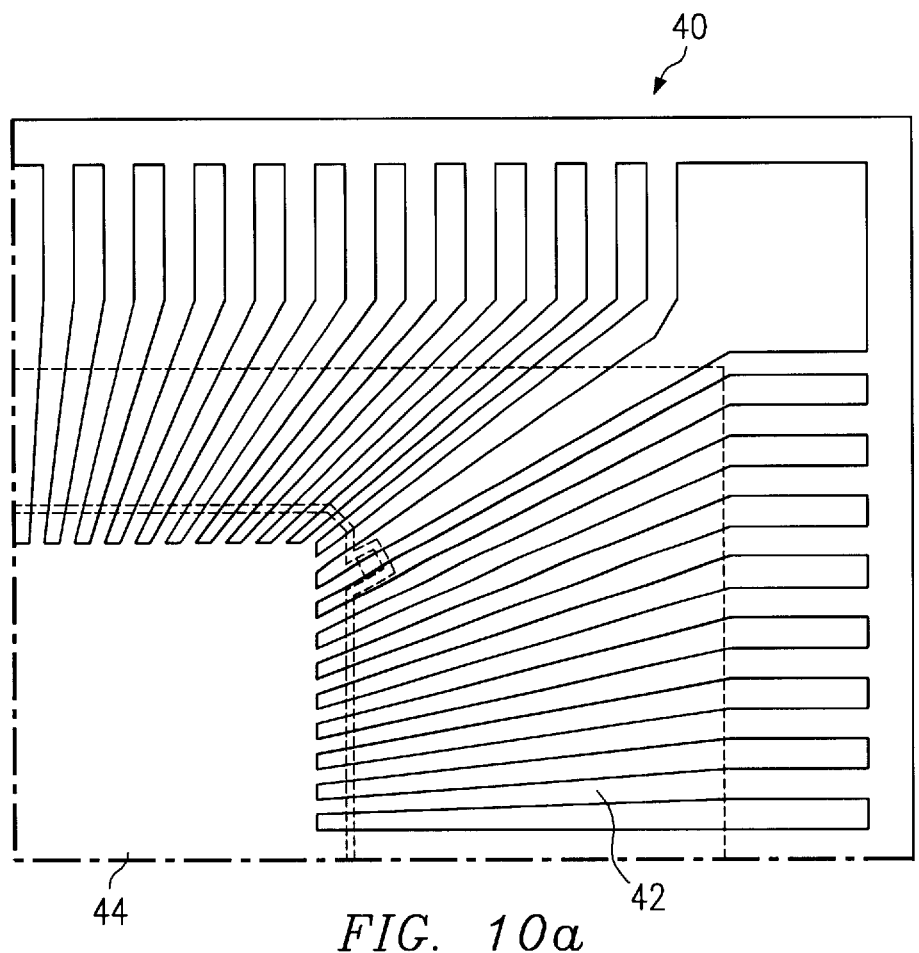
FIG. 10a is a top view of a quadrant of the lead frame after the lead frame has is been clamped, according to the present invention.
Figure 10B:
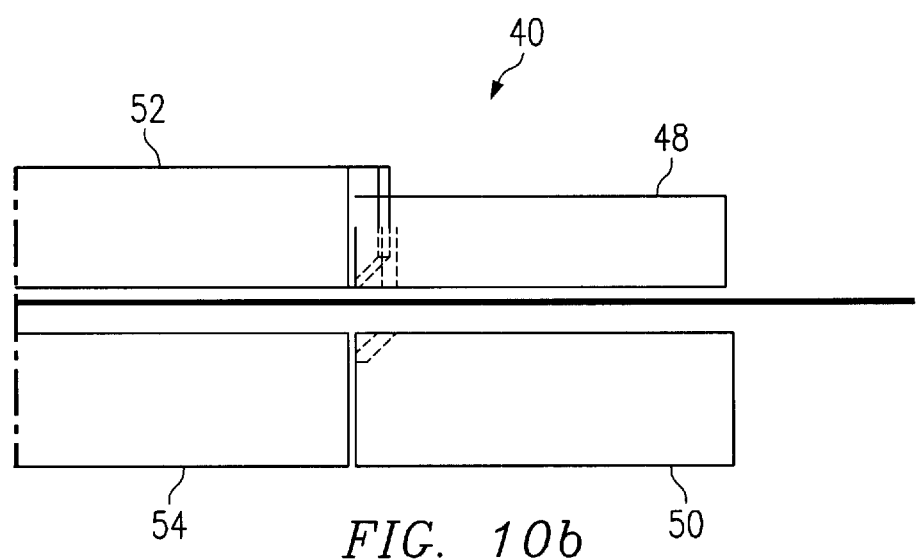
FIG. 10b is a cross-sectional view of the quadrant of the lead frame of FIG. 10a, according to the present invention.
Figure 11:
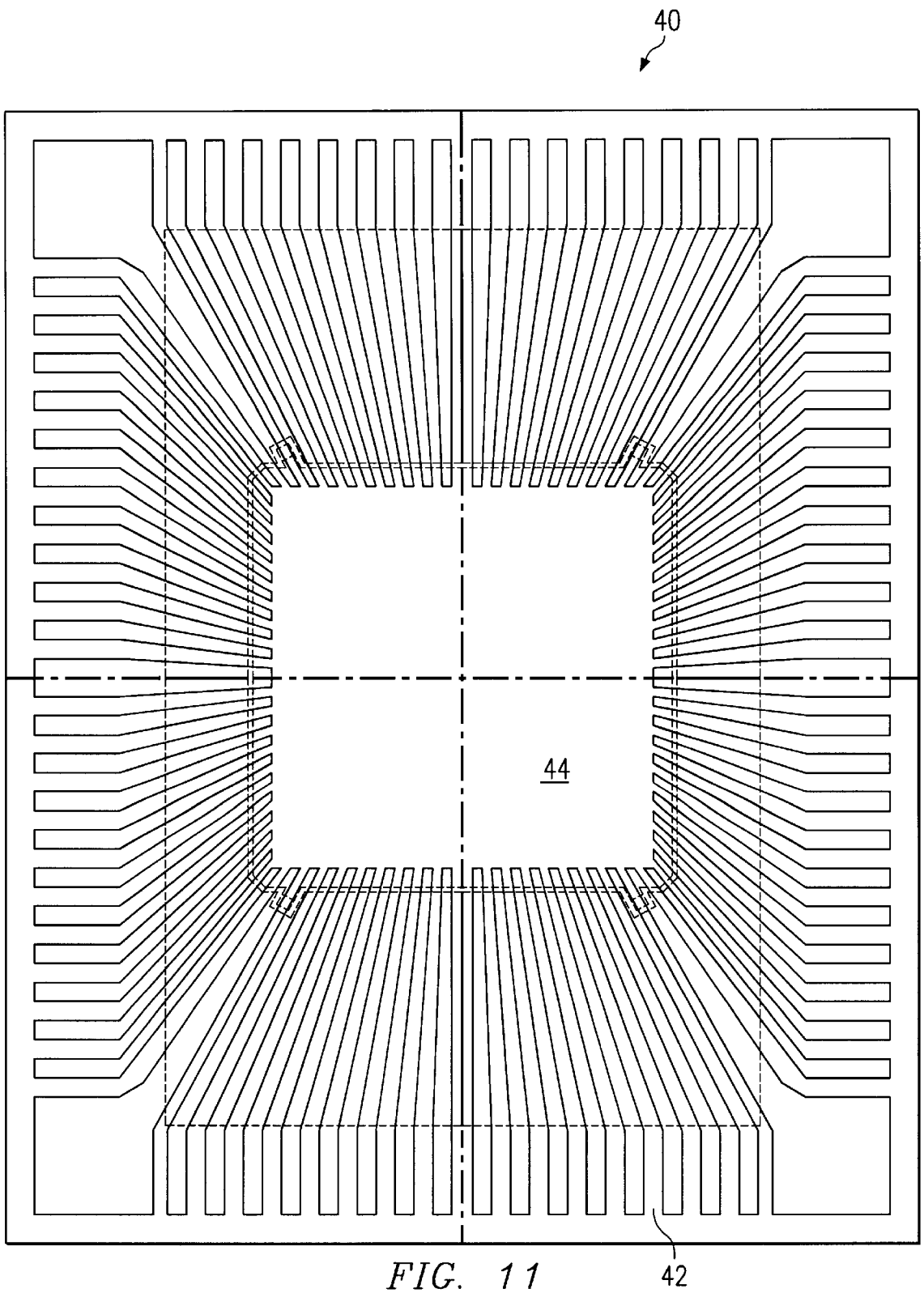
FIG. 11 is a top view a lead frame after the lead frame has been clamped, according to the present invention.
Figure 12A:
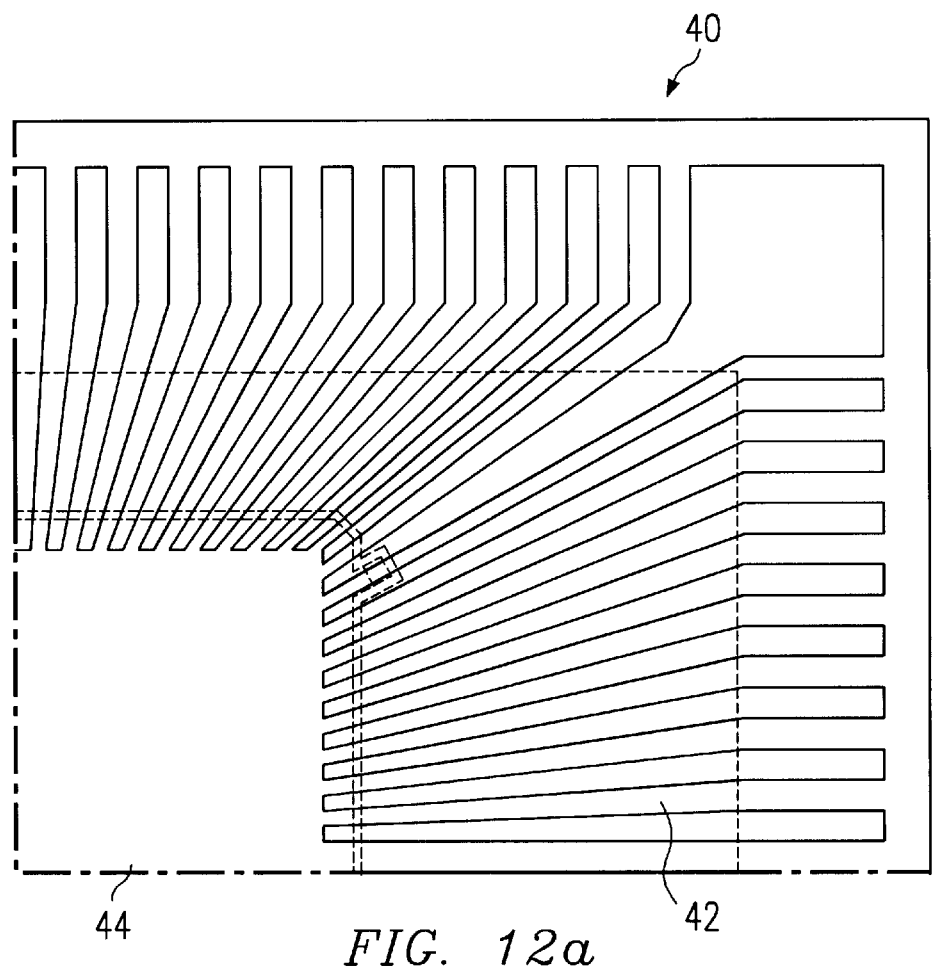
FIG. 12a is a top view of a quadrant of the lead frame after the lead frame has been simultaneously cut and downset with a punch die pair, according to the present invention.
Figure 12B:
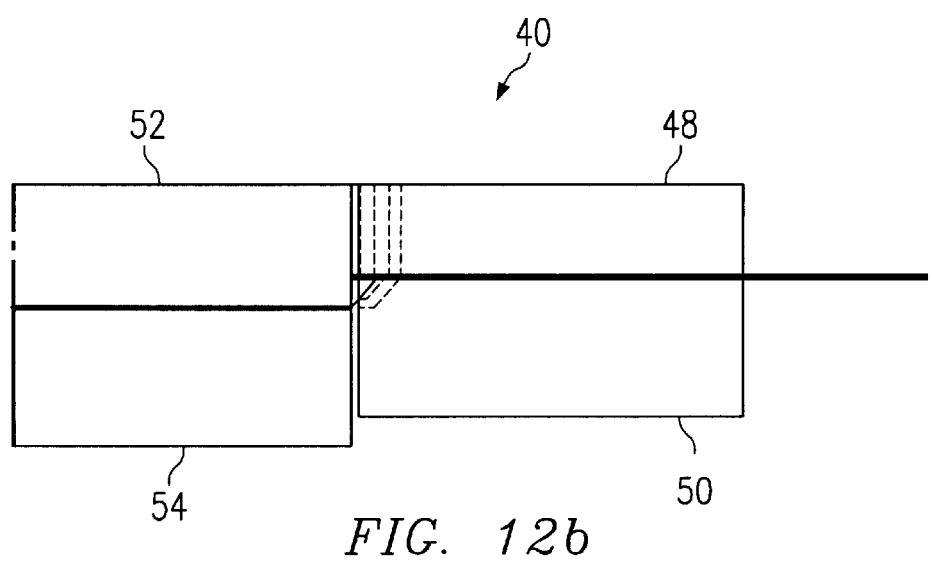
FIG. 12b is a cross-sectional view of the quadrant of the lead frame of FIG. 12a, according to the present Invention.
Figure 13:
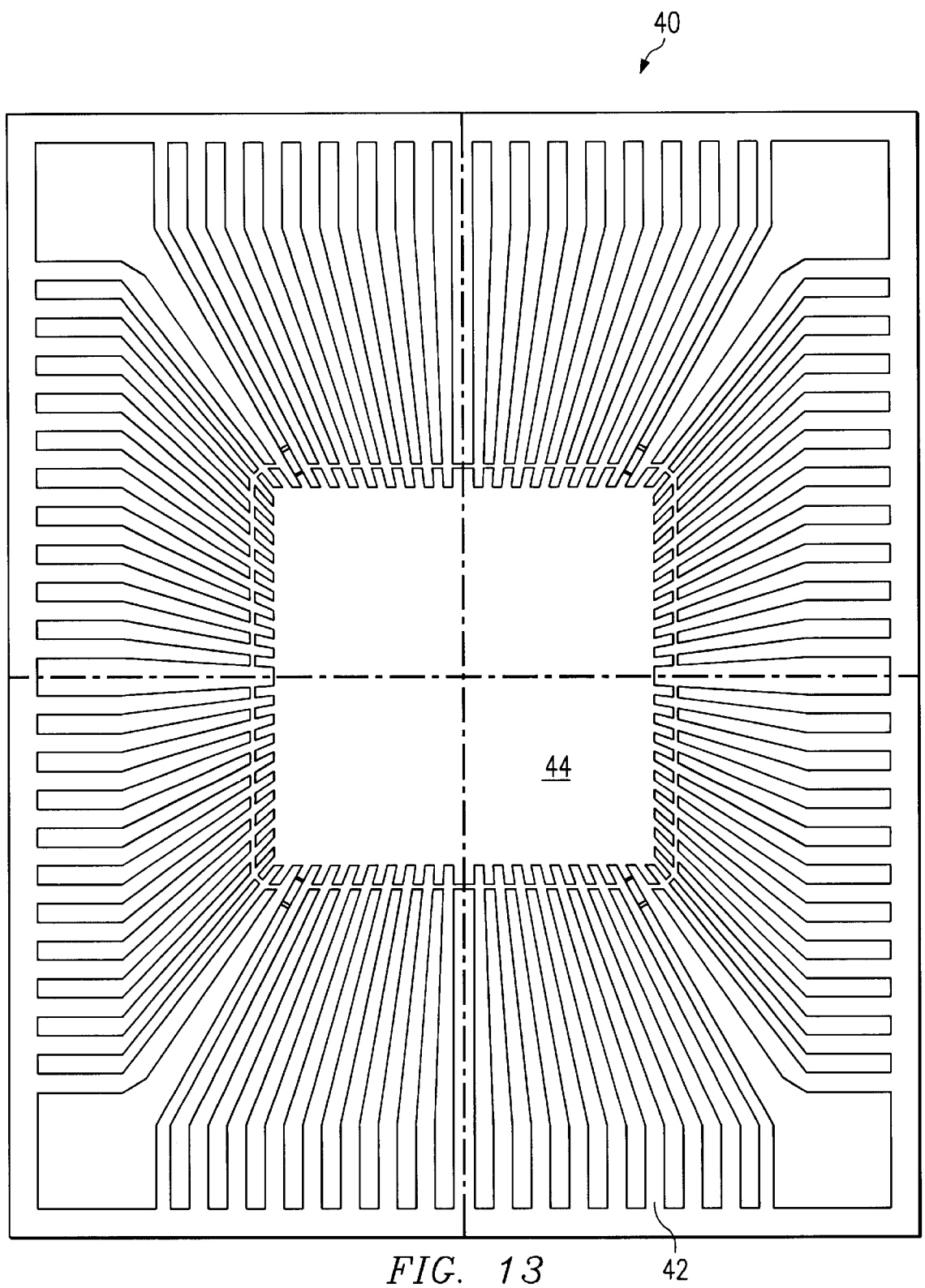
FIG. 13 is a top view of the lead frame after the lead frame has been simultaneously cut and downset with a punch die pair, according to the present invention.
Figure 14A:
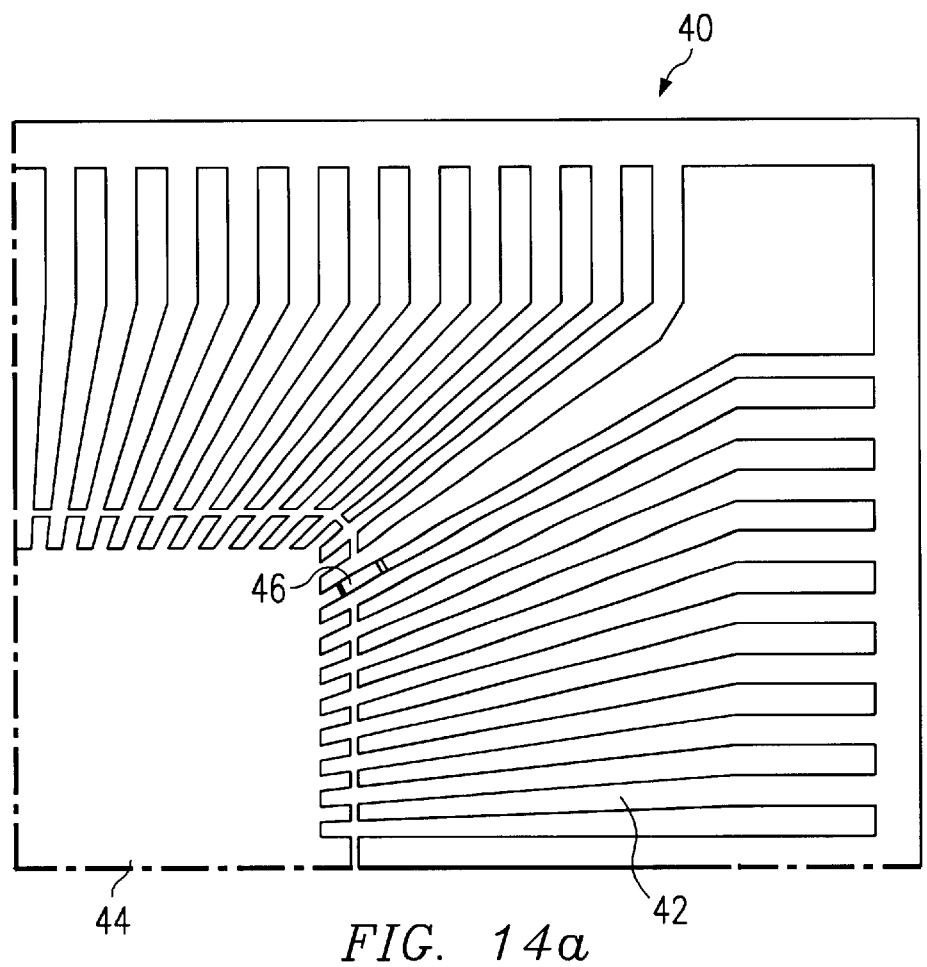
FIG. 14a is a top view of a quadrant of the lead frame after the lead frame has been unclamped, according to the present invention.
Figure 14B:
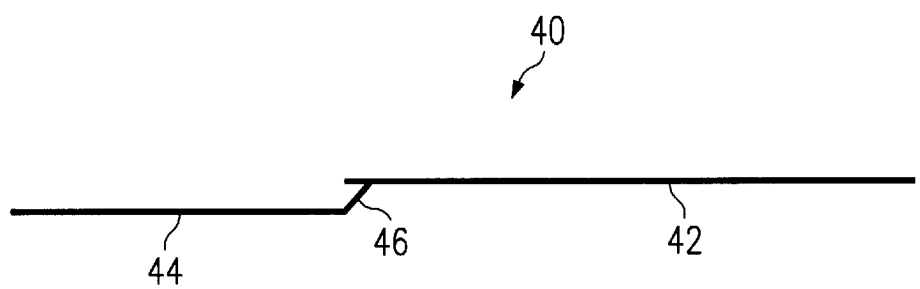
FIG. 14b is a cross-sectional view of the quadrant of the lead frame of FIG. 14a showing a tie bar after the die pad has been downset with respect to the lead fingers of the lead frame, according to the present invention.
Figure 15:
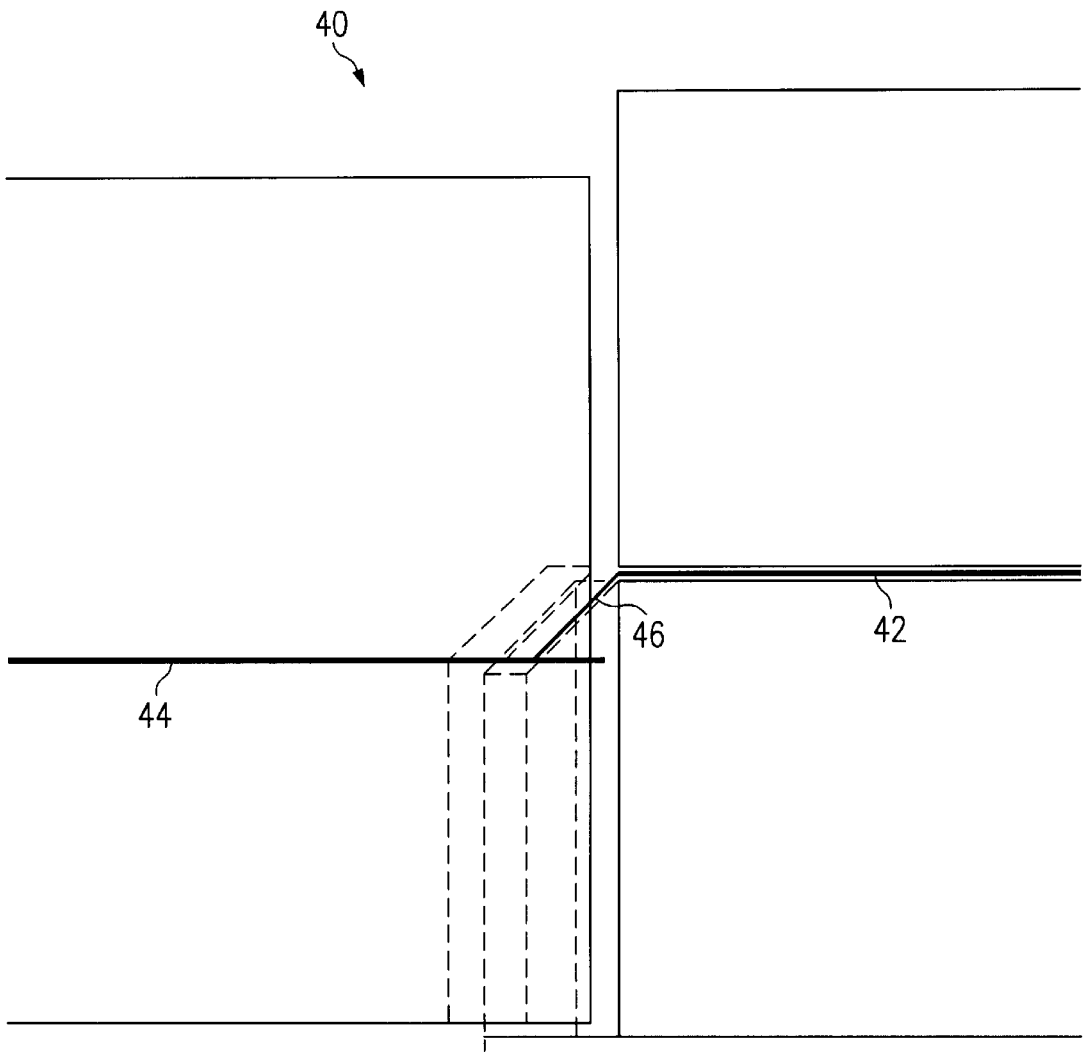
FIG. 15 is a blow-up cross-sectional view of the lead frame showing a tie bar after the die pad has been downset with respect to the lead fingers of the lead frame, according to the present invention.

Referring to FIGS. 9a to 15, the manufacturing process for fabricating a lead frame of a plastic integrated circuit package according to the present invention is illustrated. As in tile prior art, fabrication begins with a rectangular sheet of metal from which the lead fingers of the lead frame are formed. Referring to FIG. 9a, the top view of a quadrant of a lead frame 40 after the lead fingers 42 have been defined, including a quadrant of the die pad 44 of the lead frame, is shown. The plurality of lead fingers 12 are formed from a rectangular sheet of metal as is well known in the art. FIG. 9b illustrates the cross-sectional view of the quadrant of the lead frame at this stage of the process. Next, as shown in FIG. 10a, the top view of a quadrant of the lead frame 40, is to clamp the lead frame 40 into a fixed position prior to being simultaneously cut and downset with a punch die pair. FIG. 10b illustrates the cross-sectional view of the quadrant of the lead frame, the upper clamp 48 and lower clamp 50, and the upper punch die 52 and lower punch die 54. FIG. 11 shows the top view of the entire lead frame 40 at this stage of the process. The last step in the present invention process, as shown in FIGS. 12a–15, is to simultaneously separate the lead fingers 42 from die pad 44 and downset the die pad 44 with respect to the lead fingers 42 by shearing the lead frame with a punch die pair.

At a substantially central portion of the lead frame 40, a square die pad 44, configured for mounting a semiconductor or chip thereon, supported by a plurality suspension tie bars 46 is formed by shearing the lead frame 40 with a punch die pair and a lower clamp 50 that are mated such that the punch die pair may be inserted into the lower clamp 50 with essentially a 0 gap of no more than 2 percent of the lead frame 40 thickness. The punch die pair having 90 degree cutting surfaces and a plurality of recesses along the cutting surfaces forming the plurality tie bars as the lead frame 40 is sheared. As shown in the cross-sectional view of FIG. 15, performing the separation and downset of die pad 44 from lead fingers 42 results in essentially no horizontal gap between lead fingers 42 and die pad 44. However, the downset of die pad 44 with respect to lead fingers 42 results in a vertical separation between die pad 44 and lead fingers 42 that was also seen in the prior art. The separation and downset step may be accomplished by a simultaneous cutting and pressing operation. During the downset step, tie bar 46 is angled downward connecting lead fingers 42 to die pad 44.

Figure 16:
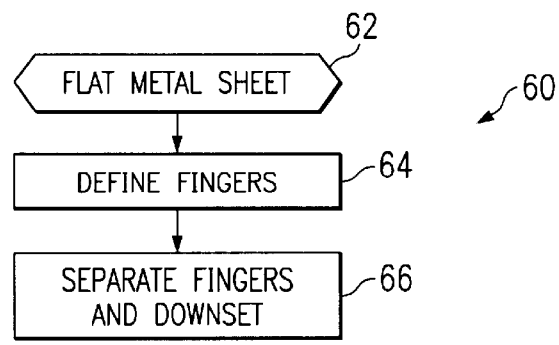
FIG. 16 is the process flow for fabricating a lead frame of a plastic integrated circuit package, according to a preferred embodiment of the present invention.
Figure 17:
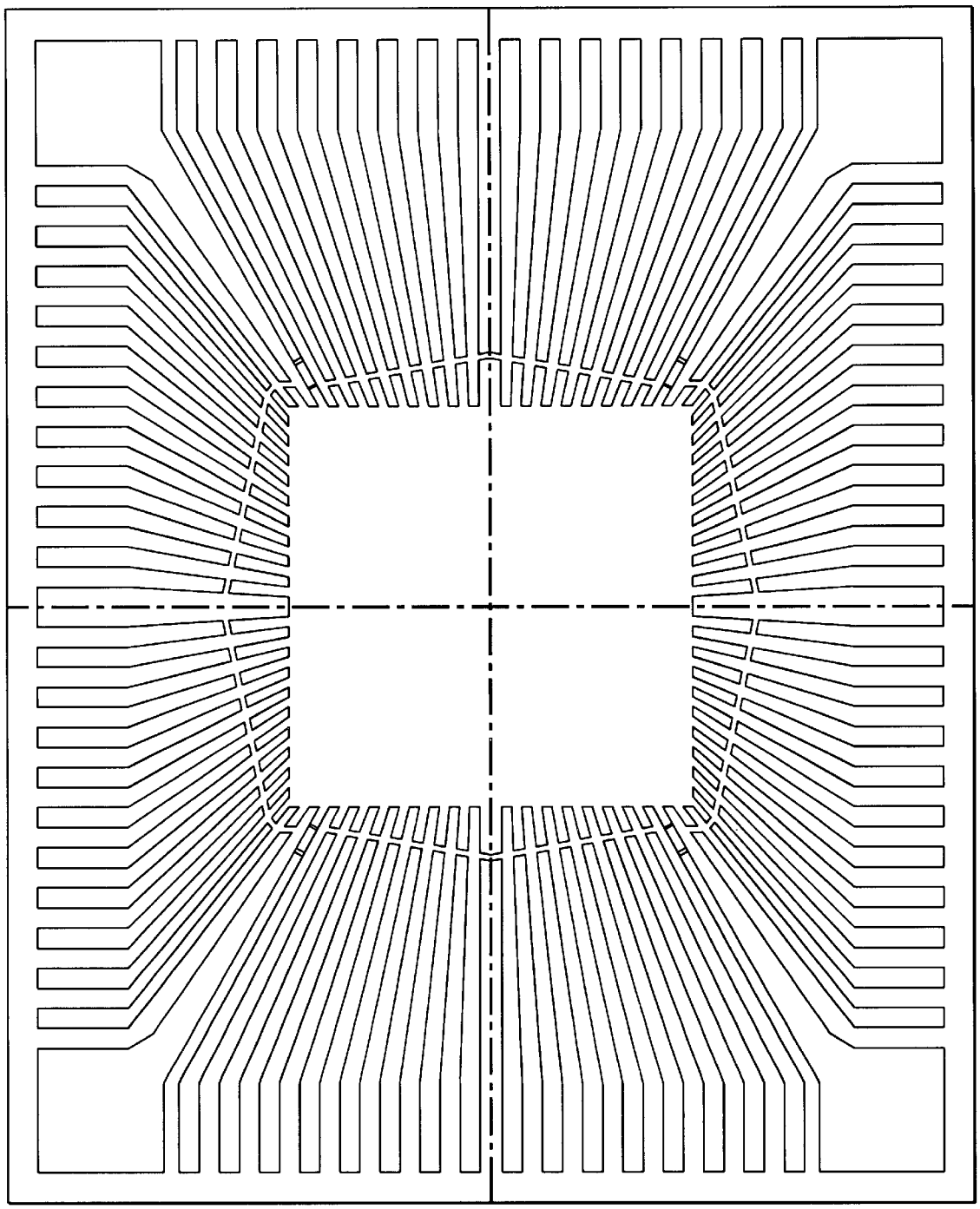
FIG. 17 illustrates an octagonal shape of the die pad.

Referring to FIG. 16, the fabrication of the lead frame of a plastic integrated circuit package, according to the present invention, is illustrated in process flow 60. First, the lead frame begins as a flat metal sheet as shown in step 62. Step 62 corresponds to FIGS. 9a and 9b. Next, at step 64, the lead fingers 42 are defined. In the next and final step of the process, the die pad 44 is simultaneously separated and downset from lead fingers 42. Step 64 results in the vertical gap between the lead fingers 42 and die pad 44 with no horizontal gap. Step 64 corresponds to FIGS. 12a–15.

The preferred embodiment of the present invention describes a process for forming a lead frame of a plastic integrated circuit device package. The resultant lead frame has a shorter critical thermal path than the prior art lead frame since there is no horizontal gap between the lead fingers and the die pad of the lead frame, unlike the prior art lead frame. The shorter critical thermal path means that the lead frame is much more efficient at dissipating the heat generated by high density integrated circuit devices.

The process for forming the lead frame only requires two steps. First, the lead fingers are defined from the flat metal sheet as shown in FIG. 9a and Step 64 of FIG. 16. Second, the die pad is clamped as shown in FIGS. 10a–11 and is simultaneously separated and downset with respect to the lead fingers as shown in FIGS. 12a–15 and Step 66 of FIG. 16.

According to an alternate embodiment of the present invention, the step of simultaneously separating and downsetting the die pad with respect to the lead fingers of the lead frame may be separated into two steps. First, the lead fingers 42 are separated from the die pad 44 using a cutting tool, such as a laser, that results in essentially no horizontal gap. Second, the die pad 44 is downset with respect to the lead fingers 42. The resultant lead frame is the same as illustrated in FIGS. 10 and 11. There is no horizontal gap between the lead fingers 42 and die pad 44. There is a vertical gap between the lead fingers 42 and die pad 44 caused by the downset of die pad 44.

The alternate embodiment process for forming the lead frame would still provide the advantage of shortening the critical thermal path of the lead frame and therefore improve the thermal dissipation characteristics of any plastic integrated circuit device package into which it is placed.

While the invention has been particularly shown and described with reference to a preferred embodiment, it will be understood by those skilled in the art that various changes in form and detail may be made therein without departing from the spirit and scope of the invention.

What is claimed is:

1. A lead frame of an integrated circuit device package, comprising:

a die pad having a first side, a second side, a third side, and a fourth side; and a plurality of lead fingers with a plurality of first quadrant lead fingers arranged about the first and second sides of the die pad in a first quadrant, a plurality of second quadrant lead fingers arranged about the second and third sides of the die pad in a second quadrant, a plurality of third quadrant lead fingers arranged about the third and fourth sides of the die pad in a third quadrant, and a plurality of fourth quadrant lead fingers arranged about the fourth and first sides of the die pad in a fourth quadrant, wherein the die pad is separated from the plurality of lead fingers with essentially no horizontal gap and essentially no horizontal overlap between the first and second sides of the die pad and the plurality of first quadrant lead fingers, the second and third sides of the die pad and the plurality of second quadrant lead fingers, the third and fourth sides of the die pad and the plurality of third quadrant lead fingers, and the fourth and first sides of the die pad and the plurality of fourth quadrant lead fingers.

2. The structure of claim 1, wherein the die pad is a octagonal shape.

3. The structure of claim 1, wherein the integrated circuit device package is plastic.

4. The structure of claim 1, wherein the die pad is downset from the plurality of lead fingers defining a vertical separation between the die pad and the plurality of lead fingers.

5. The structure of claim 4, wherein the die pad has an octagonal shape.

6. The structure of claim 1, wherein a first horizontal gap between the first and second sides of the die pad and the plurality of first quadrant lead fingers is approximately no more than two percent of the thickness of the lead frame, a second horizontal gap between the second and third sides of the die pad and the plurality of second quadrant lead fingers is approximately no more than two percent of the thickness of the lead frame, a third horizontal gap between the third and fourth sides of the die pad and the plurality of third quadrant lead fingers is approximately no more than two percent of the thickness of the lead frame, and a fourth horizontal gap between the fourth and first sides of the die pad and the plurality of fourth quadrant lead fingers is approximately no more than two percent of the thickness of the lead frame.

\* \* \* \* \*